United States Patent [19]
Ishida et al.

[11] 4,035,673
[45] July 12, 1977

[54] HERMETICALLY SEALED MOUNT FOR A PIEZOELECTRIC TUNING FORK

[75] Inventors: Fujio Ishida, Kokubunji; Haruo Suda, Tokorozawa, both of Japan

[73] Assignee: Citizen Watch Co. Limited, Tokyo, Japan

[21] Appl. No.: 642,210

[22] Filed: Dec. 18, 1975

[30] Foreign Application Priority Data

| Dec. 24, 1974 | Japan | 49-147683[U] |
| June 23, 1975 | Japan | 50-086787[U] |
| July 8, 1975 | Japan | 50-094304[U] |
| Oct. 21, 1975 | Japan | 50-142540[U] |
| Nov. 5, 1975 | Japan | 50-132671 |
| Nov. 8, 1975 | Japan | 50-151913[U] |

[51] Int. Cl.² .................................. H01L 41/04
[52] U.S. Cl. .......................... 310/8.9; 310/9.4
[58] Field of Search ............. 310/8.2, 9.1, 9.4; 58/23 TF

[56] References Cited

U.S. PATENT DOCUMENTS

| 3,683,213 | 8/1972 | Staudte | 310/9.1 X |
| 3,766,616 | 10/1973 | Staudte | 310/8.2 X |
| 3,805,098 | 4/1974 | Carpenter et al. | 310/9.1 |
| 3,805,509 | 4/1974 | Assmus | 310/9.1 X |
| 3,851,193 | 11/1974 | Ritter | 310/9.4 |
| 3,909,639 | 9/1975 | Kawai et al. | 310/9.1 |
| 3,940,638 | 2/1976 | Terayama | 310/9.4 |
| 3,969,641 | 7/1976 | Oguchi et al. | 310/9.4 X |

*Primary Examiner*—Mark O. Budd
*Attorney, Agent, or Firm*—Frank J. Jordan

[57] ABSTRACT

A mechanical vibrator for a timepiece in which a ceramic supporting substrate is rigidly secured to an inner wall of an evacuated housing. The supporting substrate is formed at its one surface with a pair of conducting metal layers serving as leads and at its other surface with a conducting metal layer over a substantially large area. A piezoelectric vibrating element having exciting electrodes is placed on the ceramic supporting substrate and rigidly connected thereto such that the electrodes of the piezoelectric vibrating element are electrically connected to the conducting metal layers formed on the one surface of the ceramic supporting substrate. The conducting metal layers are in turn connected to projecting leads extending outwardly of the evacuated housing and adapted to be connected to a printed circuit of the timepiece.

26 Claims, 16 Drawing Figures

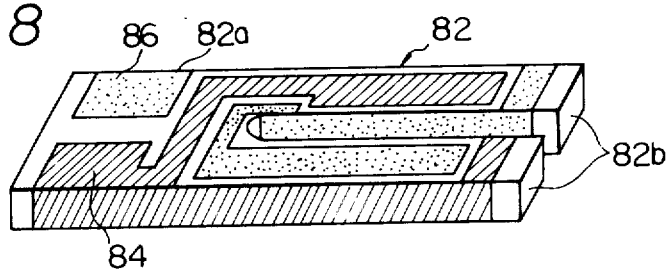
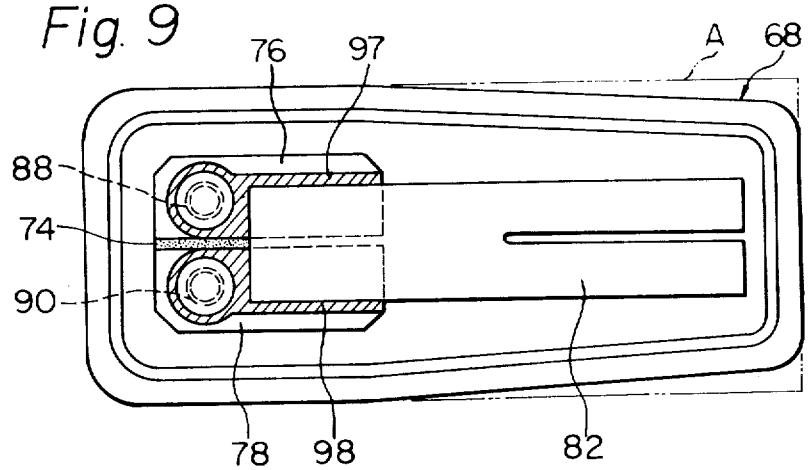
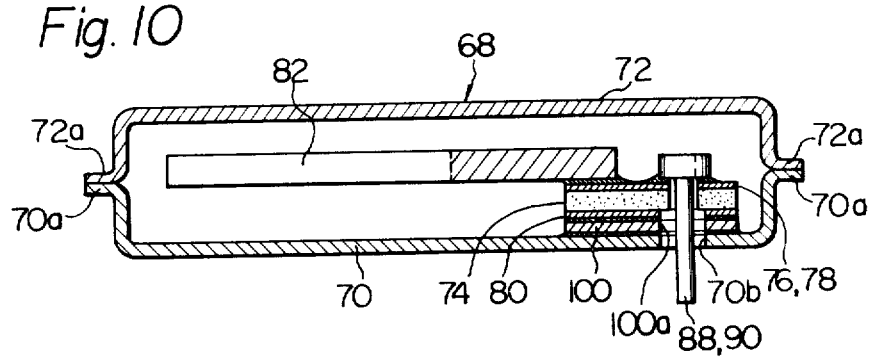

HERMETICALLY SEALED MOUNT FOR A PIEZOELECTRIC TUNING FORK

This invention relates in general to a mechanical vibrator for a timepiece and, more particularly, to a miniaturized piezoelectric vibrator used as a source of frequency standard for an electronic timepiece.

As is well known, piezolectric vibrator employing rock crystal ($SiO_2$) or lithium tantalate ($LiTaO_3$) provide stable output frequencies with high accuracy, and thus, have heretofore been widely used as sources of frequency standard for electronic timepieces such as wrist watches. The output frequencies of the frequency standard sources employing the piezoelectric vibrators are usually converted to a lower frequency drive signal for the time display by a frequency converter connected to a driving circuit for a display device. The piezoelectric vibrators are normally classified into tuning-fork type and free-free bar type vibrators. In known electronic wrist watches, the microminiaturization of the piezoelectric vibrators and an improvement of their shock resisting properties to the maximum possible extent have been required. However, the free-free bar type vibrator has a low shock resisting property so that when a great external shock is applied to the vibrator its efficiency can be guaranteed. In contrast, the tuning-fork type vibrator has a larger shock resisting property and has been widely used in the electronic wrist watches. The tuning-fork type vibrator is usually supported by rigid supports or by flexible supports. In the former case, the prongs of the tuning fork tend to be easily broken due to impact acceleration. In the latter case, the prongs of the tuning fork are also easily broken because the tips of the prongs of the tuning fork tend to strike against the inner wall of the evacuated housing when subjected to impact. It is thus required to improve the shock resisting property of the tuning-fork type vibrator so that the vibrator is stable in operation even when subjected to a great external shock.

In known electronic wrist watches of the type employing a tuning-fork type vibrator, the structural arrangement has been such as to preclude a reduction in diameter and other dimensions of the watch components to a degree making it possible to encase the components within a lady's size watch case. Though such watches have been made in relatively large models having masculine appeal, it has not hitherto been feasible to miniaturize the dimensions to a point rendering the watch acceptable to ladies.

In seeking to miniaturize an electronic timepiece of the tuning-fork type, one is mainly confronted with two problems. One of these problems involves optimum exploitation of available space to accommodate the necessary components of the watch. The other problem relates to the ease of assembly and disassembly of certain watch components. To some extent, the solution to one problem is incompatible with the solution to the other, for if one succeeds in tightly packing the watch components within a very limited space, it usually renders it difficult to carry out assembly and disassembly operations. It is thus preferable to microminiaturize the piezoelectric vibrator to increase the space for accommodating the other watch components to provide ease of assembling and disassembling of the watch components.

In conventional electronic timepieces of the type employing piezoelectric vibrators, it has been a common practice to mount the piezoelectric vibrator onto an insulating base plate for a printed circuit of the electronic timepiece. Typical one of the prior art mounting methods is to connect the projecting leads of the vibrator directly onto a circuit pattern of the printed circuit. Another mounting method is to resiliently support the vibrator on the printed circuit through the use of an elastic securing means such as a leaf or wire spring.

Tests have revealed that even if the foot portion of the tuning fork is rigidly secured to the evacuated housing the energy loss of the vibrator is minimized to a practically acceptable value by reducing the difference in the natural frequencies of the prongs of the vibrator. In the case of the tuning fork, however, the position error is caused by the difference in the natural frequencies of the prongs of the vibrator. The position error is the term used when the Q value of the vibrator changes by a small amount due to the difference in the securing means involving the casing of the vibrator. For example, in the state in which the crystal vibrator is mounted on the substrate of the printed circuit, the frequency change is in several PPm, i.e., one-millionth that of the vibrator per se before it is mounted on the substrate, and in the state in which the substrate supporting the vibrator is in turn mounted on the base plate the crystal impedance of the vibrator will change to an order of several thousand ohms. Thus, the position error will present serious problems on the accuracy of the electronic timepiece.

It is, therefore, an object of the present invention to provide an improved support structure for a piezoelectric vibrating element for a timepiece which overcomes the shortcomings encountered in the prior art.

It is another object of the present invention to provide a mechanical vibrator for an electronic timepiece which has an improved shock resisting property.

It is another object of the present invention to provie a miniaturized mechanical vibrator for an electronic timepiece which can be manufactured on a mass production basis.

It is another object of the present invention to provide a miniaturized mechanical vibrator which can be used as a source of frequency standard for an electronic timepiece and which is simple in construction with the use of minimum component parts and easy to assemble.

It is still another object of the present invention to provide a mechanical vibrator including a piezoelectric vibrating element which is rigidly secured to an evacuated housing in the simplest manner with the use of a specifically designed insulating supporting substrate to provide ease of assembling and improved shock resisting property to withstand impact shocks.

It is still another object of the present invention to provide a mechanical vibrator including a piezoelectric vibrating element rigidly secured to a ceramic supporting substrate which in turn is rigidly secured to an evacuated housing constituted by first and second casings at least one of which has a receptacle shape and which are secured to each other by cold welding.

It is a further object of the present invention to provide a mechanical vibrator having a rigid support structure for a piezoelectric vibrating element by which the formation of pinholes or cracks between a ceramic supporting substrate and an evacuated housing is prevented during assembling of the evacuated housing whereby the mechanical vibrator having high quality can be manufactured on a mass production basis.

It is a further object of the present invention to provide a mechanical vibrator including a piezoelectric vibrating element rigidly secured in an evacuated housing which is specifically arranged to reduce the dimension of the mechanical vibrator.

It is a still further object of the present invention to provide a unique support structure for a mechanical vibrator of an electronic timepiece, whose support structure is arranged to minimize the position error by which the influence of securing means on the frequency is practically eliminated.

It is a still further object of the present invention to provide a unique support structure including shock absorbing means for preventing a vibrating element of a mechanical vibrator from striking against the housing even when subjected to great impact shocks.

These and other objects, features and advantages of the present invention will become more apparent from the following description when taken in conjunction with the accompanying drawings, in which:

FIG. 8 is a view similar to FIG. 7 but shows a bottom surface of the vibrating element shown in FIG. 7;

FIG. 9 is a plan view of still another preferred embodiment of a mechanical vibrator according to the present invention;

FIG. 10 is a cross sectional view of a further preferred embodiment of a mechanical vibrator according to the present invention;

Figure 1:
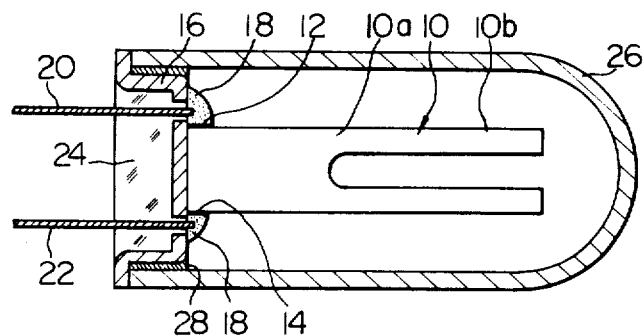
FIG. 1 is a cross sectional view of an example of a prior art mechanical vibrator.

Referring now to FIG. 1, there is shown an example of a conventional mechanical vibrator used as a source of frequency standard for an electronic timepiece. As shown, the mechanical vibrator is generally comprised of a crystal vibrator 10 in the form of a tuning fork having a foot portion 10a and prongs 10b. The crystal vibrator 10 has exciting electrodes 12 and 14 provided at the foot portion 10a and is rigidly secured to a kovar substrate 16 by an electrically conductive adhesive 18. The kovar substrate 16 is treated with some suitable insulating material. Leads 20 and 22 are connected to the electrodes 12 and 14 of the crystal vibrator 10 by the electrically conductive adhesive 18 and adjustment is made to reduce the difference in the natural frequencies if desired. The leads 20 and 22 extend through a recessed portion and bores formed in the substrate 16, which are hermetically sealed by a kovar alloy 24. Subsequently, the substrate 16 is press fitted into a casing or housing 26 in a vacuum state, and the casing 26 is hermetically sealed by a precoated soldering metal 28.

Figure 2:
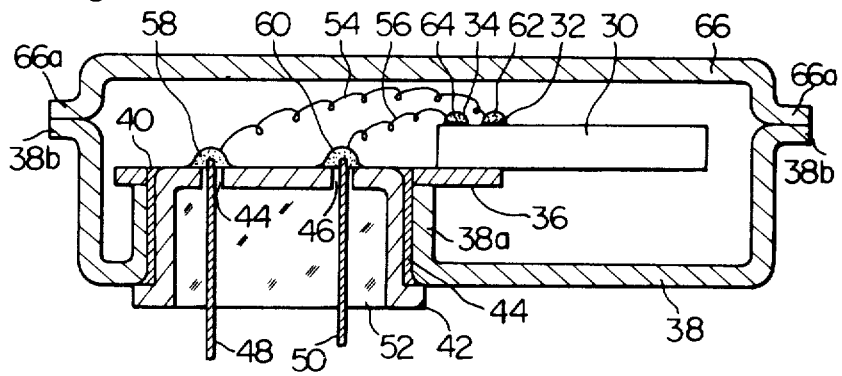
FIG. 2 is a view similar to FIG. 1 but shows another example of a prior art mechanical vibrator.

FIG. 2 illustrates another example of a conventional mechanical vibrator. In this illustrated example, a crystal vibrator 30 has exciting electrodes 32 and 34 and is rigidly secured at its foot portion to a spring support 36. The spring support 36 is in turn rigidly secured to an upper end of an inwardly extending projection 38a of a first casing 38 made of a soft metal such as copper and having a flange portion 38b. The projection 38a has a bore 40, into which a kovar substrate 42 treated with insulating material is press fitted and rigidly secured to the projection 38a by a soldering metal 40. The substrate 42 is formed with bores 44 and 46, through which projecting leads 48 and 50 extend and are rigidly held in place by a kovar glass alloy 52 which hermetically seals the bores 44 and 46. The projecting leads 48 and 50 are connected to wire leads 54 and 56 by solders 58 and 60, respectively. The wire leads 54 and 56 are in turn connected to the electrodes 32 and 34 of the crystal vibrator 30 by solders 62 and 64. After the substrate 42, first casing 38, spring support 36 and crystal vibrator 30 have been assembled in a manner as mentioned hereinabove, a second or upper casing 66 is secured at its flange portion 66a to the first casing 38 by some suitable means such as cold welding.

With the arrangements previously mentioned, shortcomings are encountered in that it is difficult to extend the lead wires outwardly from the evacuated housing in a hermetic relationship while rigidly supporting the crystal vibrating element. As a result, the evacuated housing is necessarily provided with a so-called dead spacing because of increase in the volume of the hermetic sealing means and, hence, the microminiaturization of the mechanical vibrator can not be achieved.

The present invention contemplates to overcome the shortcomings encountered in the prior art mechanical vibrators and provide a microminiaturized mechanical vibrator which is easy to assemble on a mass production basis.

Figure 3:
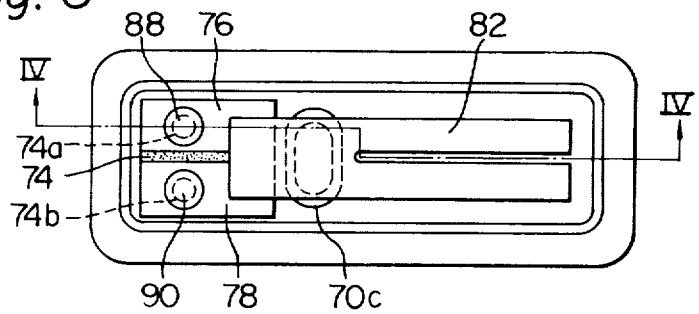
FIG. 3 is a plan view of a preferred embodiment of a mechanical vibrator according to the present invention.
Figure 4:
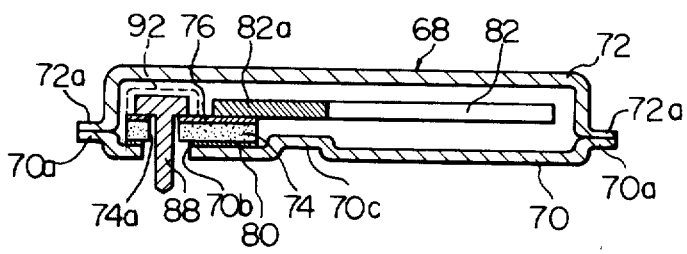
FIG. 4 is a cross sectional view taken along line IV-IV of FIG. 3.
Figure 7:
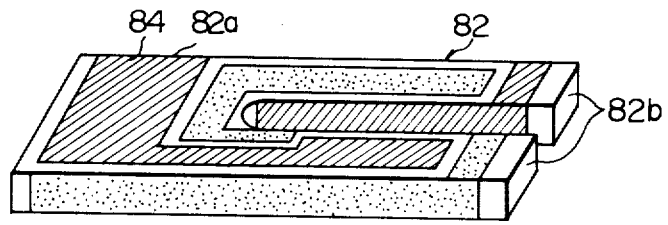
FIG. 7 is a perspective view illustrating an upper surface of a vibrating element used in the mechanical vibrator shown in FIGS. 3 to 6.

FIGS. 3 and 4 show a preferred embodiment of a mechanical vibrator embodying the present invention. As shown, the mechanical vibrator is comprised of a housing 68 including first and second casings 70 and 72 made of relatively soft metal such as copper. The first casing 70 is formed in a receptacle shape by pressure moulding and has a flange 70a formed at its periphery. The first casing 70 also has a bore 70b and a positioning projection 70c. Similarly, the second casing 72 is formed in a receptacle shape and has a flange 72a formed at is periphery. The first and second casings 70 and 72 thus shaped are secured to each other by some suitable means such as cold pressure welding. An insulating supporting substrate 74 is placed on an inner wall of the first casing 70 and rigidly secured thereto by solder. This supporting substrate 74 is made of a ceramic material such as alumina or steatite, and serves as a rigid support means or hermetic sealing means. As best shown in FIG. 3, the supporting substrate 74 has a pair of bores 74a and 74b and a pair of metal layers 76 and 78 serving as thin film electrical leads, which are separately formed on an upper surface of the supporting substrate 74 by a printing technique or vacuum evaporation. As best shown in FIG. 4, the supporting substrate 74 is also formed at its bottom surface with a metal layer 80 over a substantially large area. A vibrating element 82 in the form of a tuning fork is made of a piezoelectric material such as rock crystal ($SiO_2$) or lithium tantalate ($LiTaO_3$). As best shown in FIGS. 7 and 8, the vibrating element 82 has a foot or end portion 82a and prongs 82b, and is formed with exciting electrodes 84 and 86 terminating at the foot portion 82a. The electrodes 84 and 86 are preferably formed by plating or evaporating chromium over a substantially large surface of the vibrating element 82 and finally performing metallization with gold or aluminum over desired patterns. The vibrating element 82 thus arranged is placed at its foot portion 82a onto the leads in the form of metal layers 76 and 78, and rigidly secured thereto by solders such that the electrodes 84 and 86 of the vibrating element 82 are interconnected with the leads 76 and 78 formed on the supporting substrate 74. Projecting leads 88 and 90 are interconnected with the leads 76 and 78 by solders 92, respectively, and extend through the bores 74a and 74b of the supporting substrate 74 outwardly of the housing 68. The projecting leads 88 and 90 comprise lead pins made of suitable metal such as copper which can be easily soldered, and serve to interconnect the electrodes 84 and 86 of the vibrating element with an oscillator circuit (not shown) of the electronic timepiece.

During assembling, the metal layer 80 of the supporting substrate 74 is rigidly secured to the inner wall of the first casing 70 by brazing techniques such as silver soldering. In this case, the supporting substrate 74 can be placed in a correct position by the aid of the positioning projection 70c formed on the first casing 70. However, it should be noted that the positioning projection 70c may be dispensed with if desired. The bonding is done by thermocompression bonding, by ultrasonic bonding, or by reflow soldering, among others. Thermocompression bonding depends upon heat and pressure on the surfaces to be joined to achieve the merging of the materials of the two surfaces to form a well-bonded structure. Ultrasonic bonding accomplishes the intermetallic bond at room temperature utilizing ultrasonic energy and pressure. Finally, in reflow soldering, the bond is achieved by pretinning the two surfaces to be joined, bringing these surfaces into contact with each other, and then applying heat. Flux may be used to assist the reflow process. The foot portion 82a of the vibrating element 82 is placed on the metal layers 76 and 78 formed on the upper surface of the supporting substrate 74 and bonded thereto by soldering such that the electrodes 84 and 86 are interconnected with the metal layers 76 and 78, respectively. In this manner, the vibrating element 82 is rigidly supported by the supporting substrate 74. Subsequently, the projecting leads 88 and 90 are inserted through the bores 74a and 74b of the supporting substrate 74, and connected to the metal layers 76 and 78 by solders 92 which provide hermetic seals between the projecting leads and the bores of the metal layers. After this step, the frequency of the vibrating element is adjusted, if desired. Thereafter, the flanges 70a and 72a of the first and second casings 70 and 72 are bonded to each other in a vacuum state by cold pressure welding. It is to be noted that the soldering may be achieved at different melting temperatures in dependence on the working situations whereby the assembling is easily performed. It should also be noted that the bonding may be preferably performed utilizing brazing or soldering techniques. In addition, while the first and second casings 70 and 72 have been shown and described as having a receptacle shape, it should be understood that either one may have a flat shape, if desired.

In a modified form of the assembling process, the ceramic supporting plate 74 is soldered to the first casing 70 and, thereafter, the projecting leads 88 and 90 are soldered to the supporting substrate 74. Subsequently, the vibrating element 82 is rigidly secured to the supporting substrate 74 by soldering or electrically conductive adhesive. Finally, the second casing 72 is secured to the first casing 70 by cold pressure welding. In this manner, it is possible to assemble a mechanical vibrator in a highly reliable manner.

Figure 5:
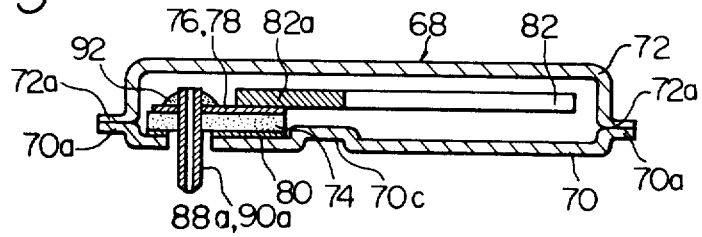
FIG. 5 is a view similar to FIG. 4 but shows another preferred embodiment of a mechanical vibrator according to the present invention.

A modified form of the mechanical vibrator is illustrated in FIG. 5 in which like or corresponding component parts are designated by the same reference numerals as those used in FIGS. 3 and 4. This modification differs in construction from the mechanical vibrator shown in FIGS. 3 and 4 in that at least one of the projecting leads 88a and 90a is replaced by a lead in the form of a pipe by which evacuation can be made either in the atmosphere or cold pressure welding of the first casing 70 and the second casing 72 can be performed in the atmosphere. With this arrangement, jigs for performing cold pressure welding can be simplified in construction, and the cold welding operation can be easily accomplished. Other details of the mechanical vibrator shown in FIG. 5 are similar to those of the mechanical vibrator of FIGS. 3 and 4 and, therefore, a detailed description of the same is herein omitted for the sake of simplicity of description.

Figure 6:
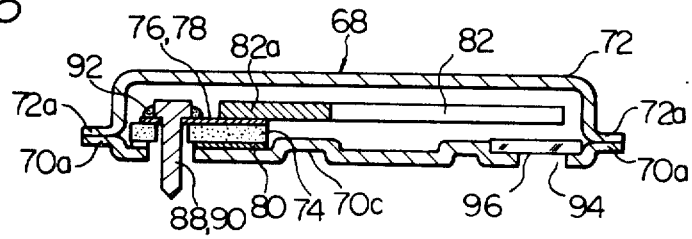
FIG. 6 is a view similar to FIG. 4 but shows another preferred embodiment of a mechanical vibrator according to the present invention.

FIG. 6 shows another modified form of the mechanical vibrator shown in FIGS. 3 and 4. In this modification, the first casing 70 is formed with an opening or window 94 which is hermetically sealed by a transparent member 96 through which frequency adjustments can be made using a laser beam. Other constructions of the mechanical vibrator shown in FIG. 6 is similar to that of FIGS. 3 and 4 and, therefore, a detailed description of the same is herein omitted.

While in the embodiments of FIGS. 3 to 6 the mechanical vibrator has been shown and described as having two projecting leads, it is to be noted that a single projecting lead may be provided with the casing being utilized as the second lead.

It will now be appreciated that in accordance with the present invention the vibrating element, supporting substrate and the casing are placed in parallel with respect to each other whereby wasteful spacing can be minimized. Since, in addition, joining portions between the component parts are simplified, the mechanical vibrator can be fabricated into thin and miniaturized construction in the easiest and simplest manner.

The dimensions of the mechanical vibrator can be further reduced by constructing the housing such that the width of the housing is gradually reduced toward the tips of the prongs of the vibrating element. More specifically, the housing 68 should have a spacing sufficient for accommodating the supporting substrate. The foot portion of the vibrating element and projecting leads and portions of the casings near these components are necessarily large. The housing should have a thickness sufficient for preventing the tips of the vibrating element form striking against the inner wall of the housing when subjected to great external shocks. The shape of the housing may be determined such that the casings are easily manufactured and provide gently curved lines to maintain a reliable hermetic seal. Since the lateral displacements of the prongs of the vibrating element are negligibly small, the housing construction can be such that the width of the housing is gradually reduced toward the tips of the vibrating element whereby wasteful spacing adjacent the tips of the vibrating element can be eliminated to provide a compact and microminiaturized construction which is also easy to manufacture.

A preferred embodiment of the mechanical vibrator to carry out the above-mentioned concept is schematically illustrated in FIG. 9, in which like or corresponding component parts are designated by the same reference numerals as those used in FIGS. 3 and 4. In this illustrated embodiment, the housing 68 is tapered toward the tips of the vibrating element 82 in a manner as previously mentioned and, thus, has a spacing lesser than that of the housing shown by a phantom line A in FIG. 9. Indicated as 97 and 98 are soldering metals which interconnect the projecting leads to the corresponding electrodes of the vibrating element 82. With this construction, the mechanical vibrator can be further miniaturized so that other components of the electronic timepiece can be positioned in the unused area.

Still another preferred embodiment of the mechanical vibrator embodying the present invention is illustrated in FIG. 10 in which like or corresponding component parts are designated by the same reference numerals as those used in FIGS. 3 and 4. In this illustrated embodiment, the mechanical vibrator further comprises a metal plate 100 serving as a shock absorbing means to prevent cracking of the supporting substrate 74 during assembling. The metal plate 100 is similar in configuration to the supporting substrate 74 and preferably has a thickness ranging from 0.05 to 0.2 mm. This metal plate 100 has bores 100a which are aligned with the bores 70b of the first casing 70 so that the projecting leads 88 and 90 extend therethrough. The metal plate 100 thus constituted is hermetically interposed between the metal layer 80 of the supporting substrate 74 and the first casing 70.

During assembling, the metal layer 80 of the supporting substrate 74 and the metal plate 100 are bonded to each other by brazing and, at the same time, the upper metal layers 76 and 78 and the projecting leads 88 and 90 are bonded to each other by brazing. In this case, it is desired that the plate 100 and the projecting leads 88 and 90 be made of a metal having high ductility and a coefficient of thermal expansion approximately equal to that of the ceramic supporting substrate 74. The discrete components are thus bonded to each other into one unit, which is soldered to the first casing 70 or bonded thereto by brazing at a relatively low temperature. Thereafter, the vibrating element 82 is bonded to the supporting substrate 74 by soldering. Finally, the second casing 72 is bonded to the first casing 70 in a vacuum state by cold pressure welding so that the housing 68 is hermetically sealed.

With the arrangement stated hereinabove, since the metal plate 100 having high ductility is disposed between the supporting substrate 74 and the first casing 70, the joined portion between the metal layer and the ceramic supporting substrate is protected by the metal plate 100 even when the first casing 70 is distorted or deformed during assembling. In practical embodiment, the casings are usually made of copper (of which coefficient of thermal expansion value, $\alpha = 17.8 \times 10^{-6}$) and therefore, it is possible to bond the ceramic supporting substrate onto the casing by brazing. Since, however, a relatively larger difference exists in coefficients of thermal expansion and contraction between the first casing and the ceramic supporting substrate, high skills are required to complete soldering operations. In accordance with the present invention, the metal plate 100 may be preferably made of an alloy such as kovar consisting of 54% iron, 29% nickel and 17% cobalt and having the thermal expansion value, $\alpha = 4.7 \times 10^{-6}$ or the like. In this case, the soldering between the ceramic supporting substrate and the metal plate can be easily made in a reliable manner. In addition, the metal plate is secured to the first casing either by brazing at low temperature or by soldering in the most easiest manner and, therefore, the workability can be highly improved.

Figure 11:
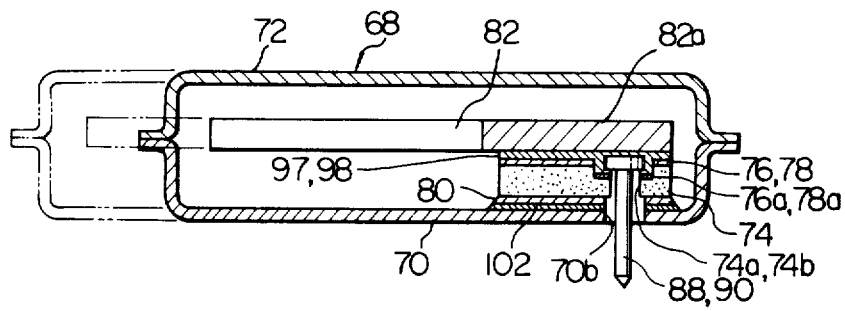
FIG. 11 is a view similar to FIG. 10 but shows a still further preferred embodiment of a mechanical vibrator according to the present invention.
Figure 12:
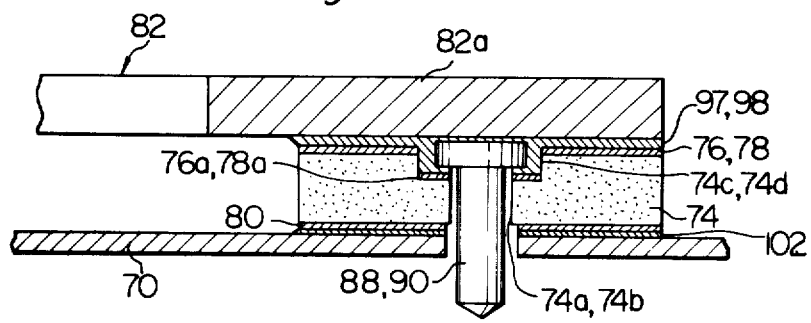
FIG. 12 is a fragmentary enlarged cross sectional view of the mechanical vibrator shown in FIG. 11.

FIGS. 11 and 12 illustrate a further preferred embodiment of the mechanical vibrator embodying the present invention. This illustrated embodiment is similar in construction to that of FIGS. 3 and 4 except that the heads of the projecting leads 88 and 90 are disposed in annular recesses 74c and 74d adjoining to the bores 74a and 74b of the ceramic supporting plate 74, respectively, and that the foot portion 82a of the vibrating element 82 is placed over the heads of the projecting leads 88 and 90 whereby the longitudinal length of the housing 68 is reduced to provide a compact construction as will be understood by phantom lines in FIG. 11.

During the manufacturing process of the ceramic supporting substrate, a sheet of green (unfired) ceramic is provided on its top and bottom surfaces with metal layers 76 and 78 and a metal layer 80, respectively, by printing. Then, the sheet of green ceramic is cut to shape and punched to provide through-bores 74a and 74b. Annular recesses 74c and 74d are formed in the sheet of green ceramic by press work and thus, the metal layers 76 and 78 are stamped to provide annular metal layers 76a and 78a which are placed on annular shoulders of the annular recesses 74c and 74d. The sheet of green ceramic thus constructed is fired and assembled with other components in a manner as previously mentioned hereinabove. The foot portion 82a is bonded to the supporting substrate 74 by soldering metals 97 and 98 or by brazing so that the annular metal layers 76a and 78a are connected to the corresponding projecting leads and electrodes of the vibrating element 82. Indicated as 102 is a brazed or soldered portion. In the practical embodiment, the tuning-fork type crystal vibrating element 82 is usually obtained by shaping the rock crystal and subjected it to many steps of process before it is bonded to the ceramic supporting substrate. During these steps, the vibrating element is supported at its foot portion and the foot portion supports thereon electrodes to be interconnected with an external component such as an oscillator of the electronic timepiece. Thus, the foot portion 82a of the vibrating element 82 should have a sufficient area for the above-noted purposes. This makes microminiaturization of the entire assembly difficult. The illustrated embodiment in FIGS. 11 and 12 makes it possible to provide a very compact and microminiaturized structure by stacking the foot portion 82a on the projecting leads 88 and 90.

Figure 13:
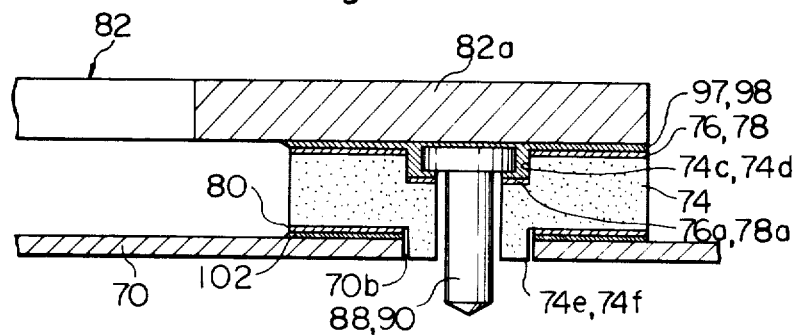
FIG. 13 is a view similar to FIG. 12 but shows a modification of the mechanical vibrator shown in FIGS. 11 and 12.

A modified form of the mechanical vibrator shown in FIGS. 11 and 12 is fragmentarily shown in FIG. 13 in which like or corresponding component parts are designated by the same reference numerals as those used in FIGS. 11 and 12. In this modification, the ceramic supporting substrate 74 is additionally formed with annular projections 74e and 74f by embossing operation. The annular projections 74e and 74f serve as positioning guides so that the supporting substrate 74 is easily positioned in an accurate position relative to the first casing 70.

The mechanical vibrator is usually supported between a base plate of the electronic timepiece and an insulating substrate made of a material such as paper epoxy resin or glass epoxy resin. The insulating substrate is suspended from the base plate and supports various circuit components such as a mechanical vibrator, a fixed condenser, a trimming condenser and IC chip etc. Since the insulating or print substrate is soft, it tends to strike against the opposing base plate when subjected to great external shocks and may crack easily. With a view to overcoming this problem, if the print substrate is spaced from the base plate with a greater distance, the thickness of the timepiece is greatly increased. The result is adverse to the trend of miniaturization of the watches. It is found out, however, that the cracking of the printing substrate can be prevented without increasing the gap between the printing substrate and the base plate.

Figure 14:
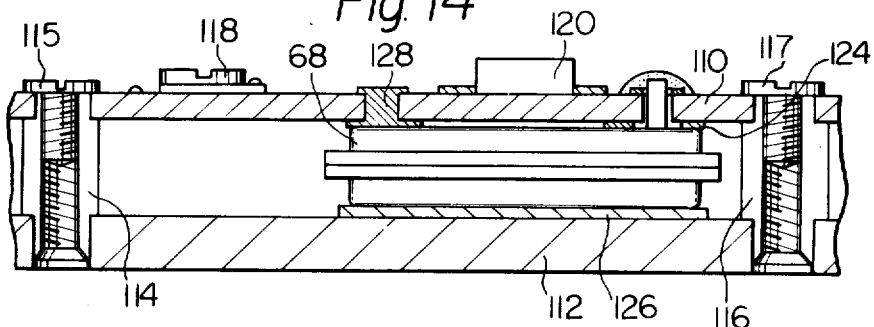
FIG. 14 is a cross sectional view illustrating a still further preferred embodiment of a mechanical vibrator according to the present invention.

A preferred embodiment to carry out the above concept is illustrated in FIG. 14. As shown, a print substrate 110 is supported on a base plate 112 of an electronic timepiece such a wrist watch by pins 114 and 116 and screws 115 and 117. The print substrate 110 is provided at its top surface with a desired circuit pattern including a trimming condenser 118 and an IC chip 120 to which leads of a mechanical vibrator is interconnected. The housing 68 of the mechanical vibrator is rigidly secured to the bottom surface of the print substrate 110 by soldering or brazing as at 124. The mechanical vibrator is thus disposed in a gas between the print substrate 110 and the base plate 112. A shock absorbing member 126 in the form of a flat plate is interposed between the mechanical vibrator 122 and the base plate 112. The shock absorbing member 126 is made of an elastic material such as resin and serves to prevent the housing 122 from striking directly against the base plate 112 when subjected to great external shocks. The shock absorbing member 126 may have any other desired shapes or configurations. Indicated as 128 is an elastic element which provides support for the housing of the mechanical vibrator 122. Displacement of the shock absorbing member 126 relative to the vibrator housing is avoided by providing a projection on the base plate 112 at a desired position or by utilizing frames or other structural parts of the electronic timepiece. It should be noted that the shock absorbing member 126 may be made of electrically conductive rubber or comprised of corrugated spring made of an electrically conductive material and, in this case, the housing 122 can be grounded up the base plate 112 by which the shielding effect is provided. In a case in which the mechanical vibrator is positioned between the print substrae and the watch case, the shock absorbing member may be disposed between the vibrator housing and the watch case.

With the arrangement mentioned hereinabove, the housing of the mechanical vibrator is prevented from directly crashing against the metal case of the base plate due to shock absorbing function of the shock absorbing member shaped in compact construction with the minimum volume. In addition, it is possible to provide a shielding effect by making the shock absorbing member with an electrically conductive material.

Figure 15:
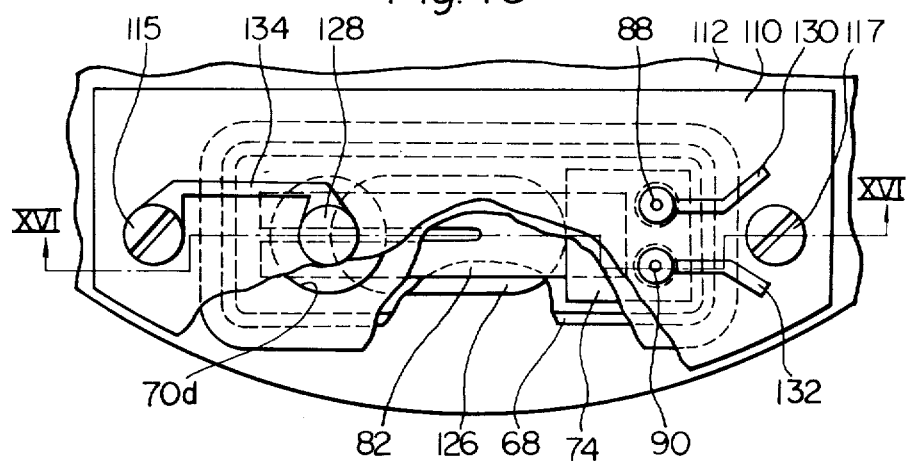
FIG. 15 is a fragmentary plan view of a still further embodiment of a mechanical vibrator according to the present invention.
Figure 16:
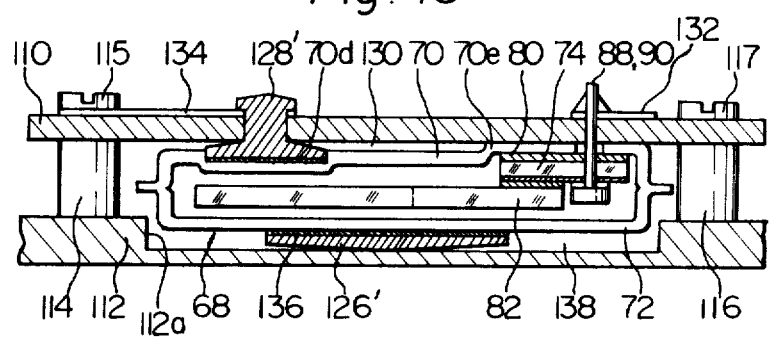
FIG. 16 is a cross sectional view taken along line XVI-XVI of FIG. 15.

A modified form of the support structure is shown in FIGS. 15 and 16 in which like or corresponding component parts are designated by the same reference numeral as those used in FIGS. 3, 4 and 14. In the structure shown in FIGS. 15 and 16, the first casing 70 of the vibrator housing 68 is formed at a portion near the support structure for the vibrating element 82 with an offset portion 70e. Thus, when the offset portion 70e of the vibrator housing 68 is rigidly secured to the print substrate 110, the remaining part of the first casing 70 adjacent the prongs of the vibrating element 82 is spaced from the print substrate 110 by a predetermined gap 130 (ranging, fro example, between 0.02 and 0.2 mm). Usually, the position error arising from the difference in the natural frequencies of the prongs of the tuning fork varies in degree in dependence on the contacting position of the vibrator housing relative to the other part. Under these conditions, if the vibrator housing is held in direct contact with the print substrate at a portion adjacent the prongs of the tuning fork, the natural frequencies of the prongs of the tuning fork are adversely affected and a greater position error will be caused. This is because of the fact that, with the tuning fork providing unbalanced natural frequencies on the prongs, the vibrating element per se is caused to rotate around the gravitational field in a direction substantially parallel to the oscillating surfaces of the prongs of th vibrating element, and that, if the vibrator housing is held in contact with the other part at a position in which the amplitudes of the frequencies are large, the influence of the contacting area on the frequency is increased. Since the acoustic impedanceof the shock absorbing member 128 with respect to the output frequency (of, for example, about 32 KHz) is relatively small, the influence of the shock absorbing member 128 on the position error is negligibly small.

As shown in FIGS. 15 and 16, the leads 88 and 90 of the mechanical vibrator are interconnected with beam leads 130 and 132 which form a part of an electronic circuit and an oscillator (not shown) of the electronic timepiece. In this modification, shock absorbing member 128' is made of an electrically conductive elastic material and secured at its bottom surface to the wall of an annular recess 70d of the vibrator housing 68 by an electrically conductive adhesive. The shock absorbing member 128' has a head which is grounded through a beam lead 134 so that the adjusted frequency is not adversely affected. Since the bottom portion of the shock absorbing member 128' is adapted to be accommodated in the annular recess 70d of the vibrator housing 68, the vibrator housing 68 can be accurately positioned in a reliable manner. As best shown in FIG. 16, the base plate 112 is formed with a substantially rectangular recess to accommodate the vibrator housing 68. Another shock absorbing member 126' is secured to the second casing 72 by a suitable electrically conductive adhesive 136 and engages adjacent wall of the annular recess 112a of the base plate 112 to provide a predetermined amount of gap 138. The influence of the shock absorbing member 126' on the position error is negligibly small for the reason as already stated hereinabove. The second casing 72 may also be grounded by making the shock absorbing member 126' with the electrically conductive rubber or resin.

A mechanical vibrator constructed as shown in FIGS. 15 and 16 was assembled employing a crystal tuning fork having a total length of 6.7 mm, a width of 1.2 mm and a thickness of 0.35 mm and a slit having a length of 3.7 mm and a width of 0.2 mm. This mechanical vibrator was housed in various cases similar to wrist watches and was subjected to drop tests. In a case where a sufficient spacing was provided around the vibrator housing, its shock resisting property was excellent and resisted the impact shock even when the case was dropped from a height of more than 150 cm. In another case where a sufficient spacing was not provided around the mechanical vibrator, it impinged upon an adjacent rigid structure and the crystal tuning fork was easily broken at the terminal end of the slit or the foot portion mounted on the supportin substrate even when the case was dropped from a lower height. It was proved that the crystal tuning fork was weak against the impact shock applied in a direction perpendicular to the plane of the tuning fork and strong against the impact shocks applied in other directions.

The shock absorbing members 126' and 128' serve as means for minimizing shocks to be applied to the vibrator housing 68 even when a sufficient spacing is not provided around the vibrator housing and the vibrator housing is caused to infringe upon the adjacent structure. The shock absorbing member 126' is shaped such that the contacting area relative to the base plate 112 is small and the rigidity of the shock absorbing member is low in a normal condition for thereby minimizing the possition error arising from this member. In this case, even when the case is subjected to a large impact shock, the mechanical vibrator is satisfactorily prevented from infringing upon the case and, thus, the vibrating element will not be broken. The shock absorbing functions of both members 126' and 128' will be effective only when the mechanical vibrator is subjected to impact shocks applied in a direction perpendicular to the plane of the wrist watch. Since, however, the crystal tuning fork forming part of the mechanical vibrator is arranged on a plane parallel to a time display dial or surface, the crystal tuning fork will sufficiently resist against the impact shocks applied in a direction parallel to the time display surface. In order to prevent the tuning fork from striking against the inner wall of the housing when subjected to larger impact shocks in the direction parallel to the time display surface, mechanical stops may be provided in the housing at positions adjacent the terminal ends of the prongs of the tuning fork. These stops may be made of suitable materials such as metal, resin or rubber and spaced by a small distance from the peripheries of the tuning fork.

It will be noted that the mechanical vibrator shown in FIGS. 15 and 16 may be modified in a manner as will be exemplified as follows:

1. The shock absorbing members 126' and 128' are dispensed with and, instead, the gaps 130 and 138 are increased to a value above, for example, 0.3 mm. With this arrangement, the mechanical vibrator is prevented from striking against the base plate 112 or the print substrate 110.

2. Likewise, the shock absorbing members are dispensed with, and the gaps 130 and 138 are not provided or reduced to minimum value of, for example, 0 to 0.1 mm. With this constitution, though the mechanical vibrator will strike against the watch case or print substrate, the shock applied to the mechanical vibrator is small because the mechanical vibrator will be brought into contact with the watch case or the print substrate at an initial stage of impact acceleration. Thus, the tuning fork is satisfactorily prevented from being broken when subjected to the impact shocks.

3. The first casing 70 is made flat and the offset portion 70e is dispensed with. In this case, the vibrator housing 68 is supported by the print substrate 110 by means of the leads 88 and 90 such that the first casing 70 is uniformly spaced from the print substrate 110 by a gap similar to the gap 138. This supporting mode is advantageous in that the mechanical vibrator is relatively softly supported by the spring action of the terminal leads and, thus, the position error is minimized. In another practice, the mechanical vibrator may be supported by the print substrate such that the vibrator housing is inclined and held in contact with the print substrate 110 over the minimum area at the position near the terminal leads.

4. The shock absorbing members 126' and 128' are integrally formed with each other. For example, a tubular rubber or plastic is cut to a suitable length, which is covered onto the mechanical vibrator. In this case, the mechanical vibrator can resist the impact shocks applied in various directions.

5. The shock absorbing members may be provided on component parts other than the mechanical vibrator or merely disposed in gaps between the component parts during assembling.

6. After the mechanical vibrator has been assembled, the shock absorbing members are maintained in their compressed conditions.

7. After the mechanical vibrator has been assembled, the shock absorbing members are slightly spaced from the adjacent component parts. The result is a decrease in the position error.

8. The shock absorbing members are provided by coating resin onto the desired components and polymerizing the same.

It will now be appeciated from the foregoing description that in accordance with the present invention a mechanical vibrator is microminiaturized and yet has an improved shock resisting property while a position error arising from securing means is minimized to a practically acceptable value. Thus, the mechanical vibrator of the present invention makes it possible to encase watch components within an extremely small and thin watch case.

While the present invention has been shown and described with reference to particular embodiments, it should be noted that other various changes or modifications may be made without departing from the scope of the present invention.

What is claimed is:

1. A mechanical vibrator for a timepiece comprising: a ceramic substrate having at least on bore formed therein and including at least one first metal layer formed on one surface of said substrate, and a second metal layer formed on another surface of said substrate over a substantially larger area thereof;

at least one lead pin passing through the bore of said ceramic substrate and having one end electrically connected to said first metal layer while said bore is hermetically sealed;

a piezoelectric vibrating element including an end portion and exciting electrodes terminating at said end portion on one surface thereof for exciting said vibrating element, said one surface of said end portion of said vibrating element being secured to said one surface of said substrate to electrically interconnect one of said exciting electrodes with said first metal layer; and an evacuated metal housing having at least one bore through which another end of said lead pin projects outwardly of said metal housing and accommodating said vibrating element and said substrate, said second metal layer of said substrate being rigidly, hermetically secured to an inner wall of said metal housing.

2. A mechanical vibrator according to claim 1, in which said first and second metal layers are formed by a printing technique.

3. A mechanical vibrator according to claim 1, in which said evacuated metal housin comprises first and second casings which are hermetically secured to each other at their flange portions by cold welding, at least one of said first and second casings having a receptacle-shape.

4. A mechanical vibrator according to claim 3, in which one of said first and second casings has a projection serving as a positioning member for said ceramic substrate.

5. A mechanical vibrator according to claim 3, in which at least one of said first and second casings has an opening hermetically closed by a transparent member.

6. A mechanical vibrator according to claim 1, in which said piezoelectric vibrating element comprises a quartz crystal.

7. A mechanical vibrator according to claim 1, in which said piezoelectric vibrating element comprises a lithium tantalate.

8. A mechanical vibrator according to claim 1, in which said piezoelectric vibrating element comprises a tuning fork having prongs extending from said end portion.

9. A mechanical vibrator according to claim 1, in which said lead pin has a through-hole formed therein which is hermetically closed after said housing has been evacuated.

10. A mechanical vibrator according to claim 1, in which said ceramic substrate has a plate form through which said bore of said substrate extends substantially perpendicular to the plane of said substrate, and said second metal layer of said substrate is bonded to the inner wall of said metal housing by a soldering metal.

11. A mechanical vibrator according to claim 1, in which the width of said metal housing gradually decreases toward another end portion of said piezoelectric vibrating element along the longitudinal axis thereof.

12. A mechanical vibrator according to claim 1, further comprising a metal plate interposed between said second metal layer of said ceramic substrate and the inner wall of said metal housing and rigidly connected thereto by a soldering metal.

13. A mechanical vibrator according to claim 11, in which said timepiece includes a base plate and an insulating plate having a printed circuit formed thereon, said insultaing plate being spaced from said base plate, and said metal housing being supported by said insulating plate.

14. A mechanical vibrator according to claim 13, in which said metal housing is secured to said insulating plate by said lead pin, said lead pin being electrically connected to said prined circuit.

15. A mechanical vibrator according to claim 13, in which said metal housing is secured to said insulating plate only at a portion near said lead pin.

16. A mechanical vibrator according to claim 13, in which said metal housing is spaced from said base plate and said insulating plate by predetermined gaps, respectively.

17. A mechanical vibrator according to claim 16, further comprising a shock absorbing member disposed between said base plate and said metal housing.

18. A mechanical vibrator according to claim 16, in which said shock absorbing member is composed of an electrically conductive elastic material.

19. A mechanical vibrator according to claim 17, in which said shock absorbing member is preassembled onto an outer wall of said metal housing.

20. A mechanical vibrator according to claim 17, further comprising a second shock absorbing member disposed between said metal housing and said insulating plate.

21. A mechanical vibrator according to claim 20, in which said second shock absorbing member is composed of an electrically conductive elastic material.

22. A mechanical vibrator according to claim 21, in which said second shock absorbing member electrically interconnects said metal housing to ground.

23. A mechanical vibrator for a timepiece comprising:

a ceramic substrate having first and second bores and including first metal layers separately formed on one surface of said substrate, and a second metal layer formed on another surface of said substrate over a substantially larger area thereof and insulated from said first metal layers by said ceramic substrate;

first and second lead pins extending through said first and second bores of said substrate, respectively, and electrically connected to said first metal layers by soldering by which said bores are hermetically sealed, said first and second lead pins being insulated from said second metal layer;

a piezoelectric vibrating element including an end portion and exciting electrodes terminating at said end portion on one surface thereof, said one surface of said end portion of said vibrating element being secured to said one surface of said substrate by brazing by which said exciting electrodes are electrically interconnected with said first metal layers; and an evacuated metal housing accommodating said vibrating element and said substrate and including first and second casings having outwardly extending flange portions, said second casing having first and second bores through which said first and second lead pins project outwardly of said metal housing, said second metal layer of said substrate being hermetically soldered to an inner wall of said second casing, and said flange portions being secured to each other by cold welding.

24. A mechanical vibrator for a timepiece comprising:
an evacuated housing;
a supporting substrate including first metal layers separately formed on one side of said vibrating element, and a second metal layer formed on another surface thereof over a substantially larger area thereof, said supporting substrate having a pair of recesses and being rigidly secured to an inner wall of said evacuated housing;
lead pins having heads accommodated in said recesses, respectively, and
a piezoelectric vibrating element including an end portion and exciting electrodes terminating at said end portion, the end portion of said vibrating element being superposed on said supporting substrate to cover the heads of said lead pins.

25. A mechanical vibrator according to claim 24, in which each of said recesses has an annular shoulder formed with a metal layer connected to each of said exciting electrodes by a soldering metal bonding said piezoelectric vibrating element and said supporting substrate to each other.

26. A mechanical vibrator according to claim 24, in which said supporting substrate has a pair of annular projections extending transversely to the plane of said supporting substrate and adapted to be accommodated in bores of said evacuated housing.

* * * * *